(12) United States Patent
Fitz-Patrick et al.

(10) Patent No.: US 9,107,293 B2
(45) Date of Patent: Aug. 11, 2015

(54) ELECTRONICS ENCLOSURES WITH HIGH THERMAL PERFORMANCE AND RELATED SYSTEM

(75) Inventors: Bruce C. Fitz-Patrick, Tucson, AZ (US); Gary A. Clayton, Vail, AZ (US); Byron E. Short, Jr., Fairview, TX (US)

(73) Assignee: Raytheon Company, Waltham, MA (US)

( * ) Notice: Subject to any disclaimer, the term of this patent is extended or adjusted under 35 U.S.C. 154(b) by 175 days.

(21) Appl. No.: 13/469,798

(22) Filed: May 11, 2012

(65) Prior Publication Data

US 2013/0299232 A1    Nov. 14, 2013

(51) Int. Cl.
| | | |
|---|---|---|
| H05K 7/20 | (2006.01) | |
| H05K 5/02 | (2006.01) | |
| B22D 25/02 | (2006.01) | |
| B22D 19/00 | (2006.01) | |
| B22D 19/04 | (2006.01) | |

(52) U.S. Cl.
CPC .............. *H05K 5/02* (2013.01); *B22D 19/0072* (2013.01); *B22D 19/04* (2013.01); *B22D 25/02* (2013.01); *H05K 7/20645* (2013.01)

(58) Field of Classification Search
CPC ................................................. H05K 7/20645
USPC .................................. 361/694, 699, 702, 714
See application file for complete search history.

(56) References Cited

U.S. PATENT DOCUMENTS

| | | | |
|---|---|---|---|
| 4,962,444 | A | 10/1990 | Niggemann |
| 5,395,499 | A | 3/1995 | Matyi et al. |
| 6,169,247 | B1 * | 1/2001 | Craft et al. .................... 174/15.1 |
| 7,187,550 | B1 * | 3/2007 | Heydari et al. ............... 361/699 |
| 7,911,793 | B2 * | 3/2011 | Attlesey ......................... 361/699 |
| 2005/0263273 | A1 | 12/2005 | Crumly |
| 2007/0256957 | A1 * | 11/2007 | Herrmann et al. ............. 206/710 |
| 2008/0018212 | A1 * | 1/2008 | Spearing et al. ............... 312/236 |
| 2009/0219692 | A1 * | 9/2009 | Wavering et al. ............. 361/699 |
| 2009/0321052 | A1 | 12/2009 | Yoshioka et al. |
| 2011/0267776 | A1 * | 11/2011 | Porreca et al. ................ 361/694 |

FOREIGN PATENT DOCUMENTS

CA    2 810 065    3/2012

OTHER PUBLICATIONS

Liquid Cooled Electronics Enclosures, Parker Hannifin Corporation Advanced Cooling Systems, Nov. 2007 Edition, 10 pages.
International Search Report dated Nov. 1, 2013 in connection with International Patent Application No. PCT/US2013/030234, 2 pages.
Written Opinion of International Searching Authority dated Nov. 1, 2013 in connection with International Patent Application No. PCT/US2013/030234, 7 pages.

* cited by examiner

*Primary Examiner* — Hung V Ngo

(57) ABSTRACT

Various apparatuses, methods, and systems are provided for cooling electronic components. For example, an apparatus includes an electronics enclosure having multiple ribs configured to separate electronic components. The apparatus also includes at least one fluid transport structure encased within the electronics enclosure. Each fluid transport structure includes multiple pipes and multiple flow channels. The flow channels are located within the ribs of the electronics enclosure, and the pipes are configured to transport cooling fluid to and from the flow channels. The fluid transport structure(s) and the electronics enclosure are formed from different materials. The at least one fluid transport structure can be resistant to corrosion caused by the cooling fluid, and the electronics enclosure can be susceptible to corrosion caused by the cooling fluid. As an example, the at least one fluid transport structure could consist essentially of nickel, and the electronics enclosure could consist essentially of aluminum.

22 Claims, 13 Drawing Sheets

ELECTRONICS ENCLOSURES WITH HIGH THERMAL PERFORMANCE AND RELATED SYSTEM

GOVERNMENT LICENSE RIGHTS

This invention was made with government support under Contract No. N00014-07D-0578 awarded by the U.S. Department of Defense. The government may have certain rights in the invention.

TECHNICAL FIELD

This disclosure is generally directed to cooling systems for electronics. More specifically, this disclosure is directed to electronics enclosures with high thermal performance and related system and method.

BACKGROUND

Various types of cooling systems have been developed for cooling electronic components. Simple cooling systems often involve the use of one or more fans for blowing cooler air over electronic components or pulling hotter air away from electronic components. High-power and densely-packaged electronics often require the use of liquid-based cooling systems, which deliver a cooling fluid to areas around electronic components. Typical cooling fluids include oil and corrosion-inhibited ethylene glycol and water. Many liquid-based cooling systems involve the use of stainless steel or aluminum structures.

SUMMARY

This disclosure provides electronics enclosures with high thermal performance and related system and method.

In a first embodiment, a method includes forming at least one fluid transport structure. Each fluid transport structure is fabricated by depositing one or more materials onto a form, and each fluid transport structure includes multiple pipes and multiple flow channels. The method also includes encasing the at least one fluid transport structure in an enclosure casting and processing the enclosure casting to form an electronics enclosure having multiple ribs configured to separate electronic components. The flow channels are located within the ribs of the electronics enclosure and the pipes are configured to transport cooling fluid to and from the flow channels.

In a second embodiment, an apparatus includes an electronics enclosure having multiple ribs configured to separate electronic components. The apparatus also includes at least one fluid transport structure encased within the electronics enclosure. Each fluid transport structure includes multiple pipes and multiple flow channels. The flow channels are located within the ribs of the electronics enclosure and the pipes are configured to transport cooling fluid to and from the flow channels. The at least one fluid transport structure and the electronics enclosure are formed from different materials.

In a third embodiment, a method includes forming at least one fluid transport structure. Each fluid transport structure is fabricated by depositing one or more materials onto a form, and each fluid transport structure includes multiple channels. The method also includes encasing the at least one fluid transport structure in an enclosure casting and processing the enclosure casting to form an electronics enclosure having multiple ribs configured to separate electronic components. The channels are located within multiple walls of the electronics enclosure and are configured to receive a cooling fluid for transporting heat away from the ribs.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 8, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, many conventional liquid-based cooling systems involve the use of stainless steel or aluminum structures. Unfortunately, stainless steel often cannot provide adequate thermal performance for densely-packed electronic components. Aluminum is highly conductive and is able to efficiently transfer heat away from electronic components. However, aluminum is also easily corroded by even mildly corrosive materials such as tap water. As a result, these types of conventional liquid-based cooling systems cannot be used in systems where high thermal performance is needed and the cooling fluid is corrosive, such as in systems that use de-ionized water and ethylene glycol without corrosion inhibitors. Also, some conventional liquid-based cooling systems require the use of multiple cooling fluids with separate fluid loops and heat exchangers, which increase the size, complexity, maintenance, performance monitoring, and cost of those cooling systems.

Figure 1:
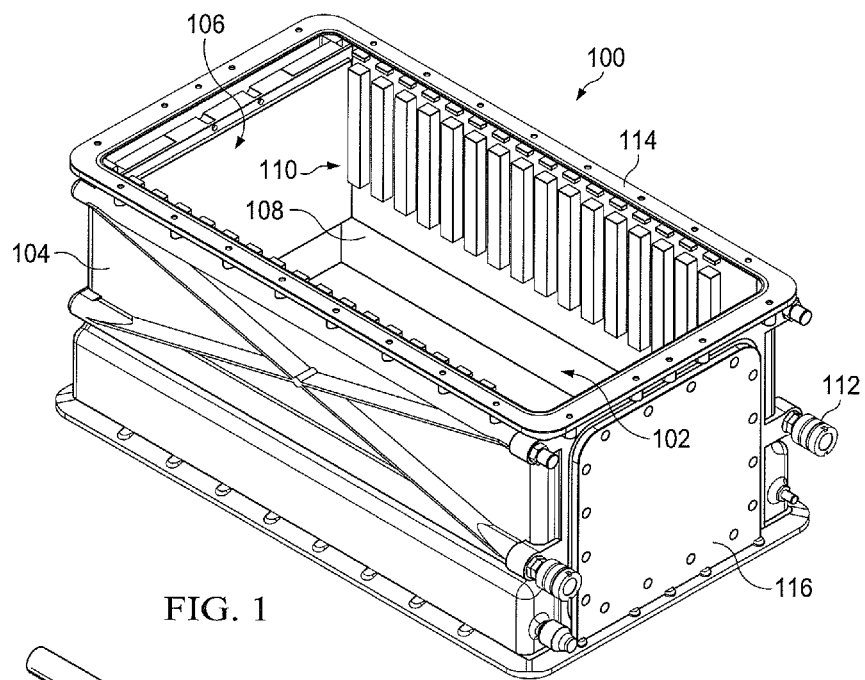
FIG. 1 illustrates a first example electronics enclosure in accordance with this disclosure.

FIG. 1 illustrates a first example electronics enclosure 100 in accordance with this disclosure. As shown in FIG. 1, the electronics enclosure 100 defines an enclosed space 102 between its walls 104. Multiple circuit boards 106 or other electronic components are placed within this enclosed space 102. The circuit boards 106 are electrically coupled to a backplane 108 or other structure within the electronics enclosure 100. The circuit boards 106 are inserted between ribs 110 formed along two inner surfaces of the walls 104. The circuit boards 106 can be secured within the electronics enclosure 100 using any suitable technique, such as with wedge locks.

In this example, the electronics enclosure 100 supports liquid-based cooling of the circuit boards 106 or other electronic components placed within the enclosed space 102 using heat conduction through the ribs 110. As a result, conduction cooled-type cards or other circuit boards 106 can be used in the electronics enclosure 100. In FIG. 1, cooling fluid is delivered and recovered through various ports 112 in the electronics enclosure 100. The cooling fluid flows through pipes within the walls 104 and through flow channels within the ribs 110, which helps to remove heat away from the circuit boards 106. As described below, the pipes and flow channels in the electronics enclosure 100 are fabricated from one or more materials resistant to corrosion. Other portions of the electronics enclosure 100 can be fabricated from one or more other materials that are vulnerable to corrosion from the cooling fluid. However, because the cooling fluid flows through pipes and flow channels that are resistant to corrosion, the electronics enclosure 100 as a whole can be used in applications where corrosive cooling fluids are used. Note that platings or coatings can be applied to the outer surface of the enclosure 100 to provide corrosion resistance to the enclosure 100.

In this document, the phrase "flow channel" refers to any path within a rib of an enclosure through which a fluid can flow. A flow channel can have any suitable length, cross-sectional shape, or other characteristics. Also, in this document, the term "pipe" refers to any path through which a fluid can flow for delivery to one or more flow channels. Again, a pipe can have any suitable length, cross-sectional shape, or other characteristics.

Note that the size, shape, and dimensions of the electronics enclosure 100 and its component parts are for illustration only, and various changes to these characteristics are within the ordinary skill in the art. For example, the electronics enclosure 100 need not have a generally rectangular cross-section, and it could include any number of ribs 110 and receive any number of circuit boards 106. Also, the electronics enclosure 100 includes a bottom plate (not shown here) under the backplane 108 or other structure. This bottom plate further defines the enclosed space 102 and can help provide protection against moisture or other external elements. Further, while not shown, the electronics enclosure 100 could include a protective cover that is attached to a surface 114 located at the top of the walls 104. In addition, a hatch or plate 116 can cover an access passage into the enclosed space 102. The hatch or plate 116 can have any suitable size, shape, and dimensions and can be secured to a wall 104 of the electronics enclosure 100 in any suitable manner. The hatch or plate 116 can include connectors for coupling to external power, radio frequency, fiber optic, or other cables.

Figure 2A:
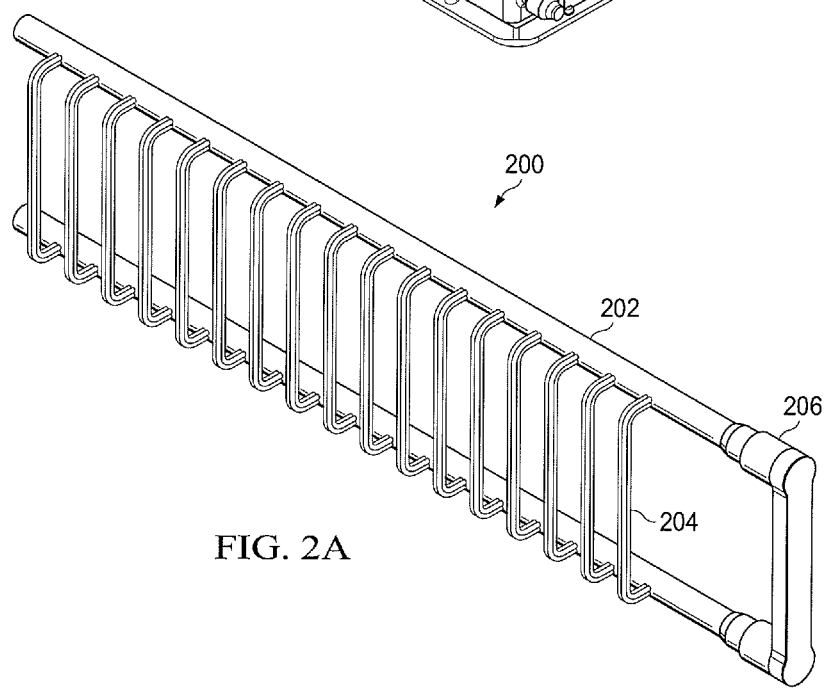
FIGS. 2A through 2H illustrate an example technique for forming the electronics enclosure of FIG. 1 in accordance with this disclosure.

FIGS. 2A through 2H illustrate an example technique for forming the electronics enclosure 100 of FIG. 1 in accordance with this disclosure. As shown in FIG. 2A, the technique begins with a form 200. The form 200 represents a structure around which another structure is to be formed. In this example, the form 200 includes two cylindrical regions 202 physically attached to rib regions 204. The cylindrical regions 202 represent areas where pipes for transporting cooling fluid are being formed, and the rib regions 204 represent areas where flow channels for transporting cooling fluid through the ribs 110 are being formed. The form 200 also includes end regions 206, which include areas where the various ports 112 of the electronics enclosure 100 are being formed. Note that end regions 206 are joined here, which is merely done as a process aid. The form 200 can be fabricated from any suitable material(s) and in any suitable manner. In some embodiments, the form 200 is fabricated by machining an aluminum structure into the appropriate form. In other embodiments, a stereo lithography (SLA) plastic part can be fabricated, such as by using an investment casting of an alloy.

Figure 2B:
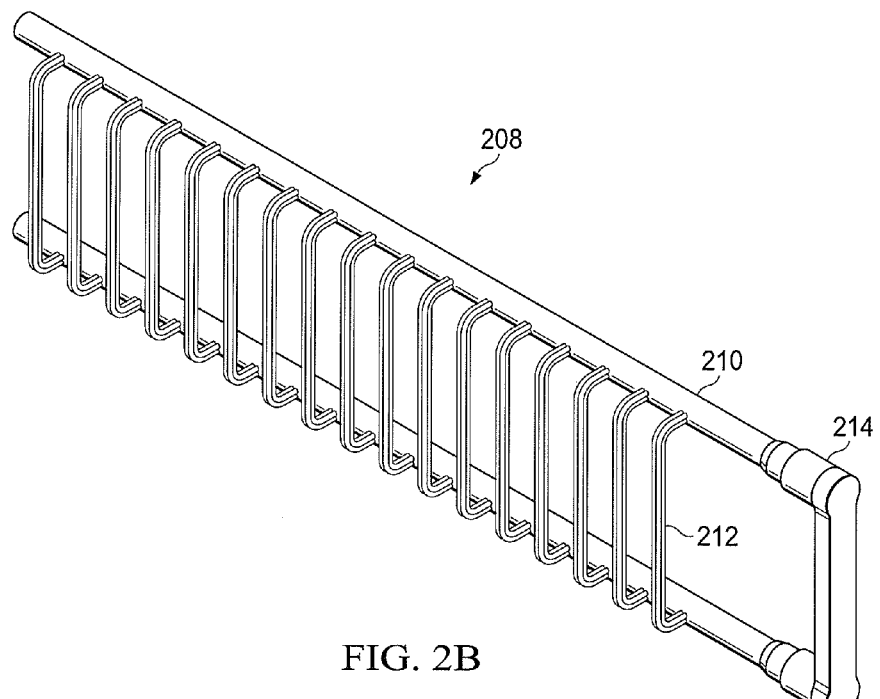

As shown in FIG. 2B, a fluid transport structure 208 is formed over the form 200. The form 200 therefore functions as a mandrel for forming the fluid transport structure 208. The fluid transport structure 208 includes pipes 210, flow channels 212, and ports 214. When used within the electronics enclosure 100, one pipe 210 transports cooling fluid from one port 214 to the flow channels 212. The cooling fluid then passes through the flow channels 212, which provides cooling within the ribs 110 of the electronics enclosure 100. The cooling fluid then passes through another pipe 210 to another port 214 and exits the electronics enclosure 100.

The fluid transport structure 208 can be formed from any suitable material(s) resistant to corrosion caused by the cooling fluid to be used. For example, the fluid transport structure 208 can be formed from pure or substantially pure nickel. The fluid transport structure 208 can also be formed in any suitable manner. In some embodiments (such as where the form 200 is fabricated from aluminum), nickel can be electroformed on the form 200. In other embodiments (such as where the form 200 is fabricated from an SLA plastic part), the plastic part can be sprayed with a conductive paint or other material(s) (such as a copper-based lacquer), and nickel can then be electroformed on the form 200. The nickel in the fluid transport structure 208 could have any suitable thickness, such as a minimum thickness of about 5 mil (0.005") to about 20 mil (0.02"). Certain portions of the fluid transport structure 208 could also be thicker than other portions, such as when the ports 214 have a thickness that is about 5 mil (0.005") to about 10 mil (0.01") thicker than the pipes 210.

Figure 2C:
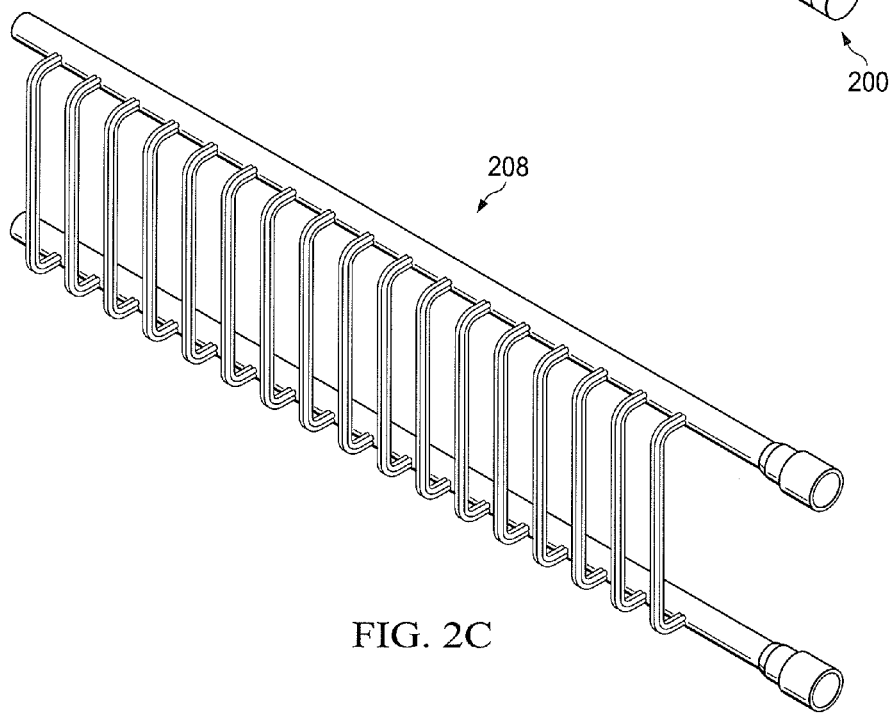

As shown in FIG. 2C, all or substantially all of the form 200 is physically removed, leaving the fluid transport structure 208. The form 200 can be removed in any suitable manner. For example, various portions of the form 200 could be removed using caustic or other chemical etchants, drilling, burning, or any other suitable processing operations. The specific removal technique(s) used can depend at least partially on the material(s) forming the form 200. The resulting structure can be further processed in any suitable manner to form a finalized fluid transport structure 208.

Figure 2D:
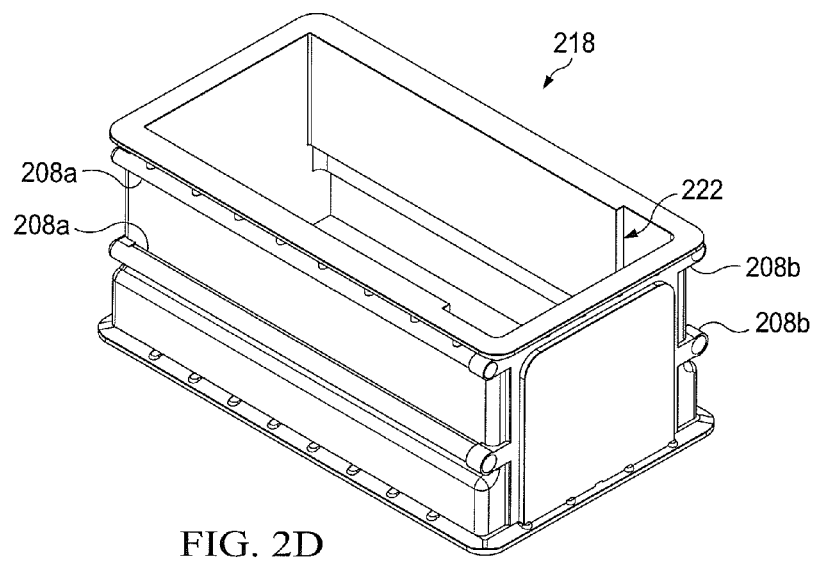
Figure 2E:
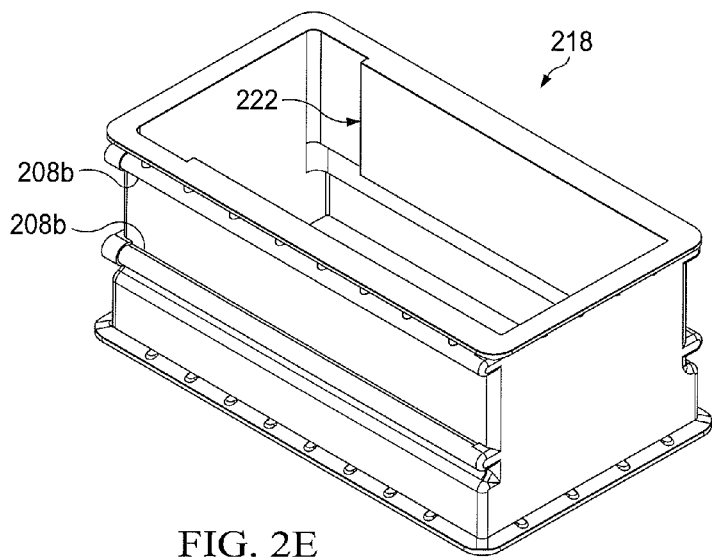
Figure 2F:
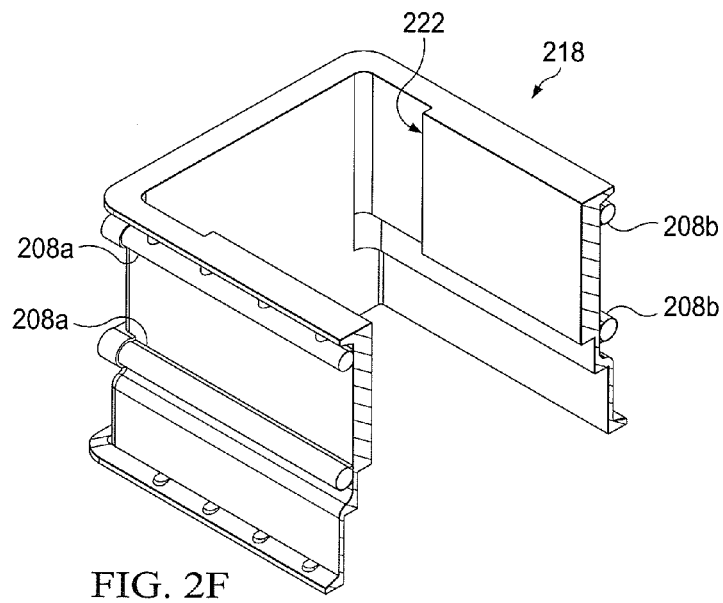
Figure 2G:
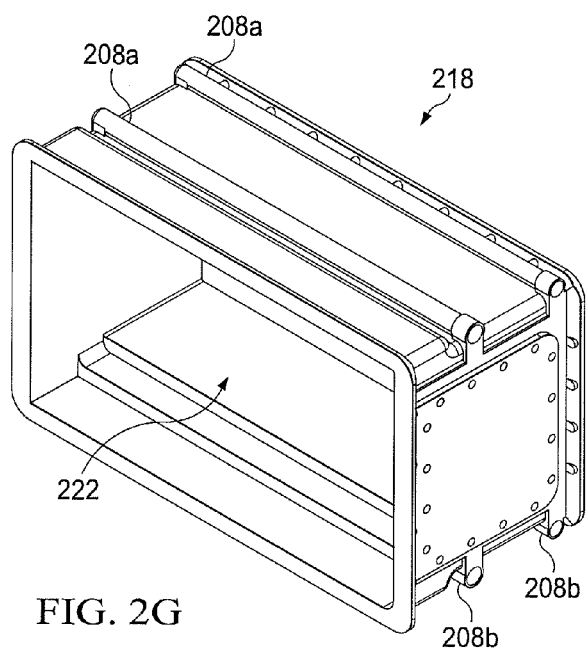

Multiple fluid transport structures 208a-208b can be fabricated in the manner shown in FIGS. 2A through 2C, and an enclosure casting 218 can then be formed as shown in FIGS. 2D through 2G. FIG. 2D illustrates a top and front isometric view of the enclosure casting 218, and FIG. 2E illustrates a top and back isometric view of the enclosure casting 218. Also, FIG. 2F illustrates a cut away section isometric view of the enclosure casting 218, and FIG. 2G illustrates a bottom isometric view of the enclosure casting 218.

The enclosure casting 218 represents a structure that is formed around the fluid transport structures 208a-208b. In other words, the fluid transport structures 208a-208b are embedded or encased within the enclosure casting 218. In this example, the fluid transport structures 208a-208b are encased in opposite sides of the enclosure casting 218. The enclosure casting 218 has a form that is similar to the final shape of the electronics enclosure 100. However, among other things, the enclosure casting 218 includes raised plateaus 222 along two of its inner walls. The raised plateaus 222 represent areas where the flow channels 212 of the fluid transport structures 208 are encased and the ribs 110 are to be formed. The enclosure casting 218 can be formed from any suitable material(s), such as aluminum. The enclosure casting 218 can also be formed in any suitable manner, such as by using the fluid transport structures 208a-208b as a mold core and casting aluminum around the fluid transport structures 208a-208b. As a particular example, the fluid transport structures 208a-208b can be overcast in SLA to create a form and aluminum can be embedded in the SLA form to create the casting.

Figure 2H:
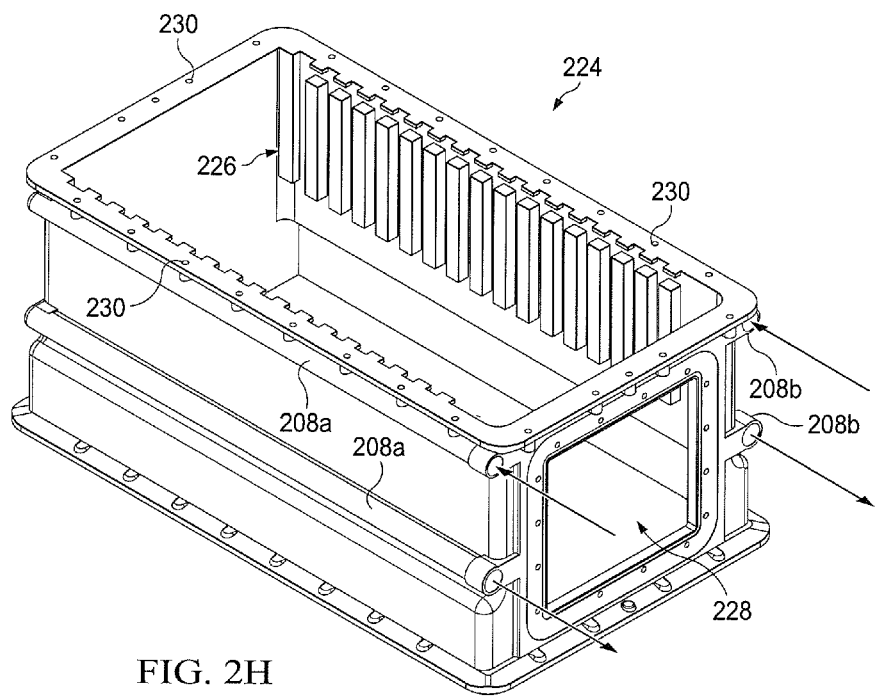

The enclosure casting 218 is then processed to create a final enclosure structure 224 as shown in FIG. 2H. The processing includes forming ribs 226 in the raised plateaus 222. The processing also includes forming an opening 228 in the front wall of the enclosure structure 224. The processing further includes forming various threaded holes 230 or other structures used to secure a protective cover or plate/hatch to the enclosure structure 224. Any suitable processing technique could be used to form the ribs, holes, or other structures of the enclosure structure 224 from the enclosure casting 218, such as by machining an aluminum enclosure casting 218.

In one aspect of operation, cooling fluid can be pumped, injected, or otherwise provided into one port 214 of each fluid transport structure 208a-208b. The fluid flows through one pipe 210 of each fluid transport structure 208a-208b to the encased flow channels 212 of that fluid transport structure 208a-208b. The fluid flows through the flow channels 212 within the ribs 226, transporting heat away from the ribs 226 and any electronic components in thermal contact with those ribs 226. The fluid flows through another pipe 210 of each fluid transport structure 208a-208b and exits the enclosure structure 224 through another port 214 of each fluid transport structure 208a-208b.

In this way, cooling fluid is delivered to the ribs 226 to help pull heat away from circuit boards or other electronic components within the enclosure structure 224. Moreover, the fluid transport structures 208a-208b can be formed from at least one material that resists corrosion from the cooling fluid (such as nickel). Other portions of the enclosure structure 224 can be formed from at least one other material such as aluminum that is susceptible to corrosion from the cooling fluid (although protective platings or coatings could be used), and the fluid transport structures 208a-208b help to prevent most or all of the remainder of the enclosure structure 224 from contacting the cooling fluid. As a result, cooling fluids that might otherwise be unsuitable for use in certain applications due to their corrosive effects (such as tap water or de-ionized water and ethylene glycol without corrosion inhibitors) may be used in the electronics enclosure 100. Moreover, because the enclosure 100 is fabricated in this manner, the walls 104 are contiguous and do not require the use of bolted joints or other connections that could leak. In addition, Although FIG. 1 illustrates one example of an electronics enclosure 100 and FIGS. 2A through 2H illustrate one example of a technique for forming the electronics enclosure 100, various changes may be made to FIG. 1 and FIGS. 2A through 2H. For example, various features of the electronics enclosure 100 (such as the number of ribs or external surface features) are for illustration only. Also, any other suitable technique could be used to form each fluid transport structure 208 or other structures of the electronics enclosure 100.

Figure 3A:
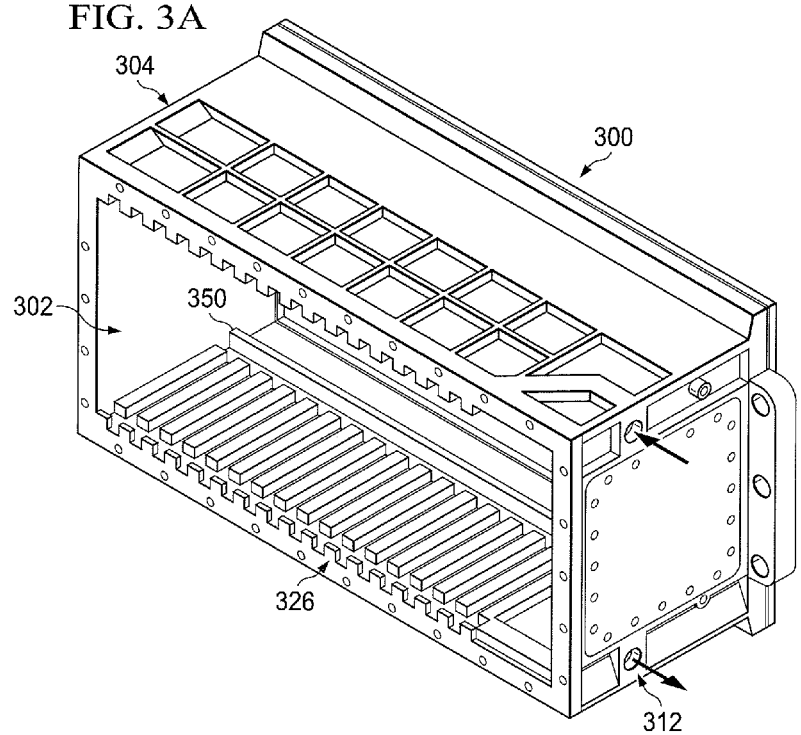
FIGS. 3A and 3B illustrate a second example electronics enclosure in accordance with this disclosure.
Figure 3B:
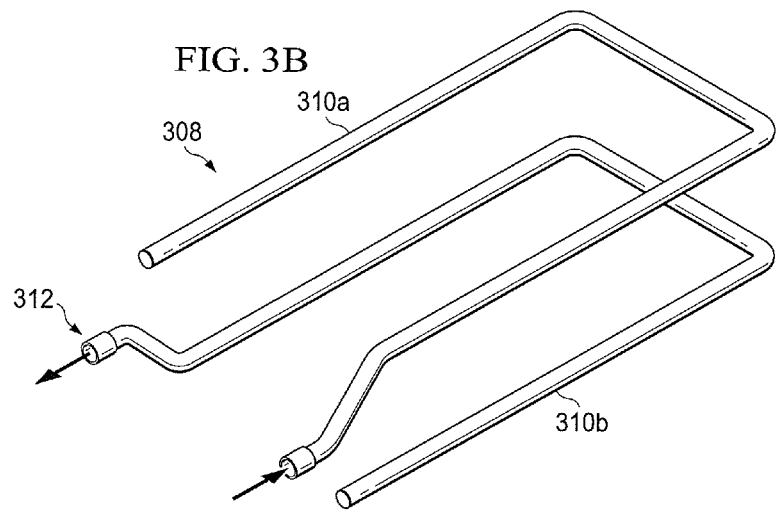

FIGS. 3A and 3B illustrate a second example electronics enclosure in accordance with this disclosure. In particular, FIG. 3A illustrates a top isometric view of an electronics enclosure 300, and FIG. 3B illustrates portions of a fluid transport structure within the electronics enclosure 300.

As shown in FIG. 3A, the electronics enclosure 300 is similar in structure to the electronics enclosure 100. The electronics enclosure 300 defines an enclosed space 302 between its walls 304. Multiple circuit boards or other electronic components can be placed within the enclosed space 302 and electrically coupled to a backplane or other structure. The circuit boards are inserted between ribs 326 formed along two inner walls of the electronics enclosure 300. A rib 350 is used to hold a backplane or other structure into which circuit boards can be inserted (a similar structure could be used in FIG. 1).

In this example, the electronics enclosure 300 supports liquid-based cooling of the circuit boards or other electronic components using two ports 312. As shown in FIG. 3B, a fluid transport structure 308 is used within the electronics enclosure 300. Here, two U-shaped pipes 310a-310b are included in the fluid transport structure 308. One pipe 310a of the fluid transport structure 308 delivers fluid to flow channels located in the ribs 326 on both sides of the electronics enclosure 300. Another pipe 310b of the fluid transport structure 308 receives fluid that has traveled through the flow channels in the ribs 326 on both sides of the electronics enclosure 300. One end of each pipe 310a-310b is terminated or blocked to prevent the flow of cooling liquid out of that end of the pipe. In this way, one port 312 can be used to deliver cooling fluid to both sides of the electronics enclosure 300, and one port 312 can be used to recover cooling fluid from both sides of the electronics enclosure 300.

A process similar to that shown in FIGS. 2A through 2H could be used to fabricate the electronics enclosure 300 of FIG. 3. For example, the fluid transport structure 308 could be formed by depositing nickel or other material(s) on an aluminum or other form and then removing the form. An aluminum or other enclosure casting can then be formed around the fluid transport structure 308, and the enclosure casting can be machined or otherwise processed to form the ribs 326 and other structures of the electronics enclosure 300.

Figure 4A:
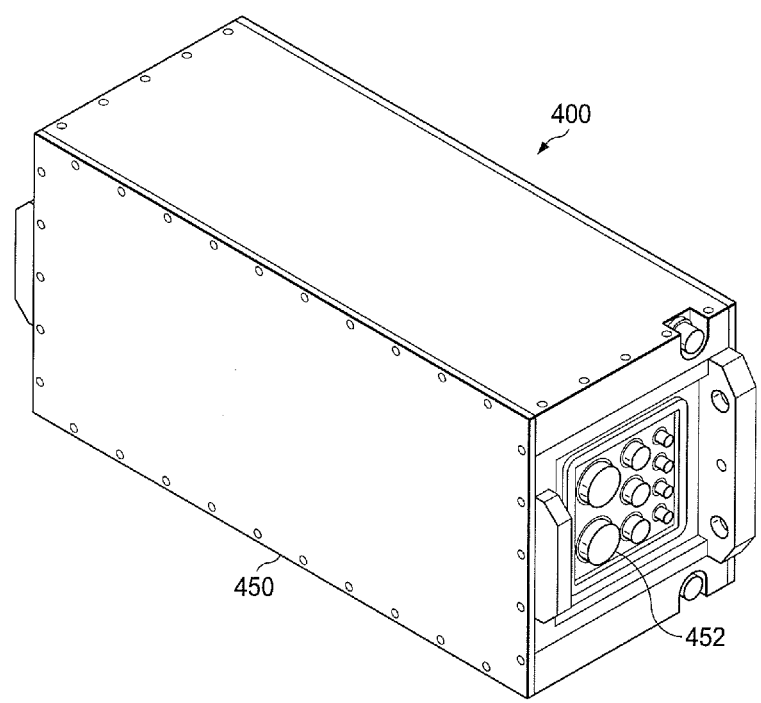
FIGS. 4A through 4C illustrate a third example electronics enclosure in accordance with this disclosure.
Figure 4B:
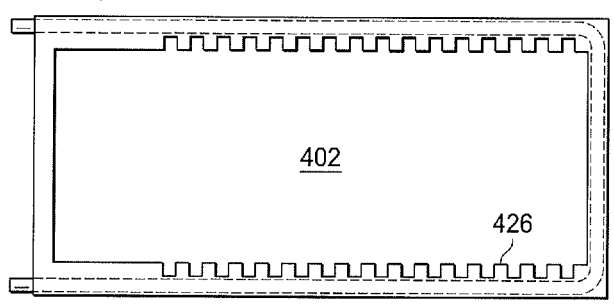
Figure 4C:
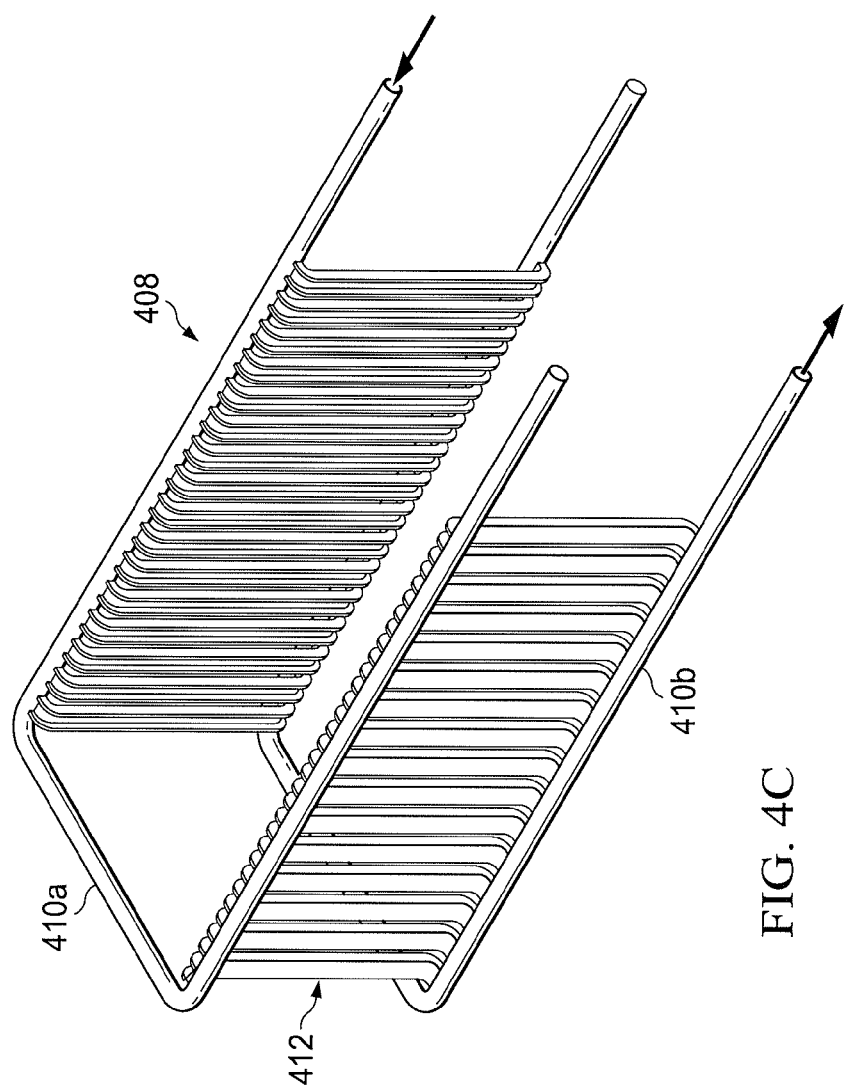

FIGS. 4A through 4C illustrate a third example electronics enclosure 400 in accordance with this disclosure. The electronics enclosure 400 is similar in structure to the electronics enclosure 300 of FIGS. 3A and 3B. For example, the electronics enclosure 400 defines an enclosed space 402 in which multiple circuit boards or other electronic components can be placed and electrically coupled to a backplane or other structure. The circuit boards are inserted between ribs 426 formed along two inner walls of the electronics enclosure 400. The electronics enclosure 400 also includes a fluid transport structure 408 having U-shaped pipes 410a-410b that transport fluid to and from flow channels 412 located within the ribs 426. In this example, each pipe 410a-410b is open at one end and terminated at the other end so that fluid entering one pipe is forced through the flow channels 412 before exiting through the other pipe.

The electronics enclosure 400 also includes a protective cover 450 attached to the top of the electronics enclosure 400. Note that the various walls and covers of the electronics enclosure 400 could form water-tight seals with adjacent walls or structures to prevent leakage of fluid into the electronics enclosure 400. The same can be true for the other enclosures described here. The electronics enclosure 400 further includes various connectors 452, which can be coupled to power, radio frequency, fiber optic, or other cables.

Again, a process similar to that shown in FIGS. 2A through 2H could be used to fabricate the electronics enclosure 400 of FIGS. 4A through 4C. For example, the fluid transport structure 408 could be formed by depositing nickel or other material(s) on an aluminum or other form, and the form can be removed. An aluminum or other enclosure casting can then be formed around the fluid transport structure 408, and the enclosure casting can be machined or otherwise processed to form the ribs 426 and other structures of the electronics enclosure 400.

In all of the embodiments described above, cooling fluid flows through channels formed from nickel or other material(s) resistant to corrosion caused by the cooling fluid. The other portions of the electronics enclosures could be formed from aluminum or other material(s). The use of aluminum is beneficial since it is inexpensive, relatively lightweight, thermally conductive, and easily machined, and various techniques are known for fabricating aluminum structures. The use of nickel is beneficial since it is easily produced using standard techniques and provides high thermal performance. Nickel is also resistant to corrosion caused by de-ionized water-based cooling fluids or other mildly corrosive liquids.

In these embodiments of the electronics enclosures, the conduction path of heat away from electronic components travels directly into the walls of the electronics enclosures, which form card guides for the circuit boards. The cooling fluid flowing through the walls and ribs of the electronics enclosures has high heat transfer capabilities, thus allowing the removal of large amounts of heat away from the electronic components. The exact paths of the pipes through an electronics enclosure can be designed to provide optimized heat transfer performance, and the design can vary depending on various factors (such as the outer shape of the enclosure and the types of circuit boards being cooled). For example, the pipes could be modeled using three-dimensional computer-aided drafting (CAD) software, and simulations could be performed to identify the expected performance of the enclosure's cooling system.

As noted above, in the embodiments described above, the electronics enclosures can be fabricated by creating one or more fluid transport structures and then encasing the structure(s) in aluminum or other material(s). After fabrication of the fluid transport structures, the structures can be tested for leaks in any suitable manner (such as using helium testing) prior to encasement. The fluid transport structures can be fabricated to have all necessary fittings and threaded regions prior to incorporation into an enclosure casting.

Although FIGS. 3A and 3B and FIGS. 4A through 4C illustrate other examples of electronics enclosures, various changes may be made to FIGS. 3A and 3B and FIGS. 4A through 4C. For example, various features of each electronics enclosure (such as the number of ribs or external surface features) are for illustration only. Also, any suitable technique could be used to form the electronics enclosures.

FIGS. 5A through 5J illustrate example flow channels inside ribs that separate electronic components within an electronics enclosure in accordance with this disclosure. More specifically, FIGS. 5A through 5J illustrate possible cross-sectional shapes of the flow channels inside the ribs of an electronics enclosure. These different cross-sectional flow channel shapes could be used in any of the electronics enclosures described above.

Figure 5A:
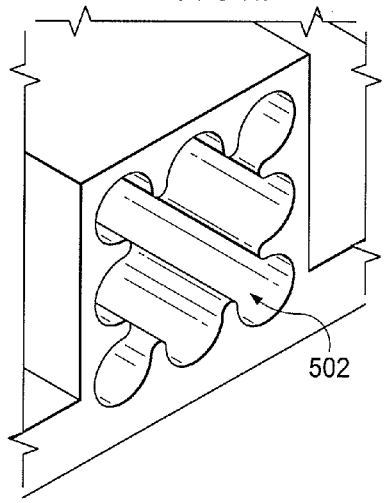
FIGS. 5A through 5J illustrate example flow channels inside ribs that separate electronic components within an electronics enclosure in accordance with this disclosure.
Figure 5B:
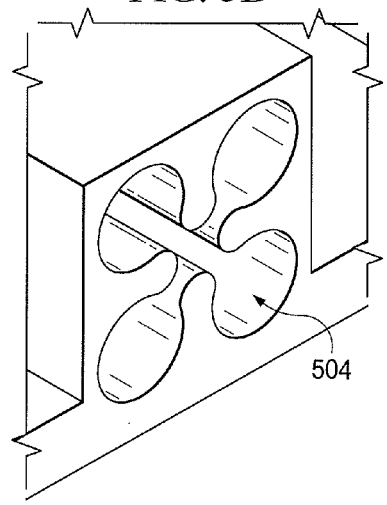
Figure 5C:
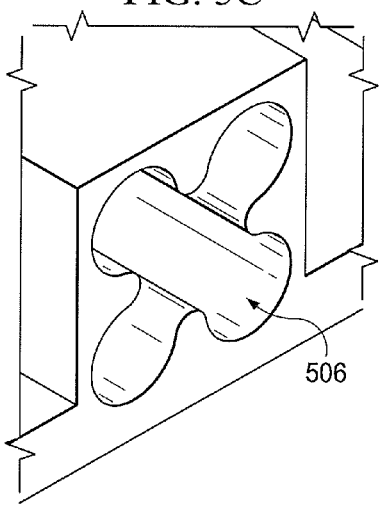

As shown in FIG. 5A, a flow channel 502 has a cross-sectional shape that can be generally described as having a central area surrounded by eight interconnected partial and near-complete circular areas. As shown in FIG. 5B, a flow channel 504 has a cross-sectional shape that can be generally described as having four circular areas interconnected via thinner paths to a smaller central circular area. As shown in FIG. 5C, a flow channel 506 has a cross-sectional shape that can be generally described as having four circular areas interconnected via thicker paths to a larger central circular area.

Figure 5D:
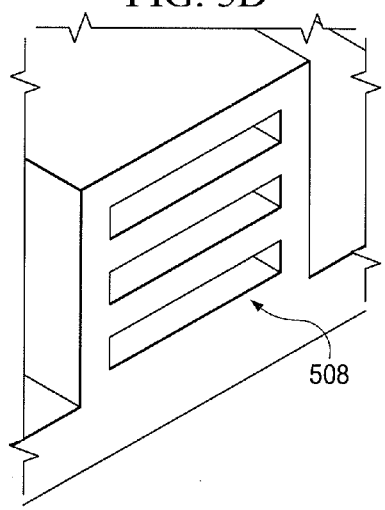
Figure 5E:
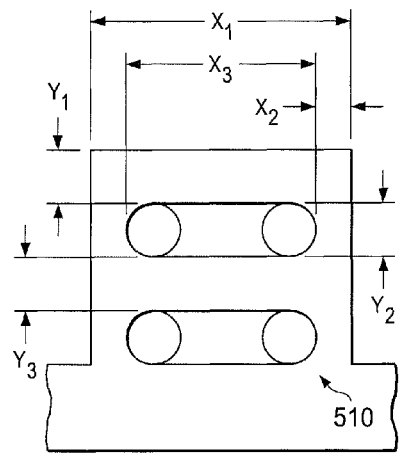
Figure 5F:
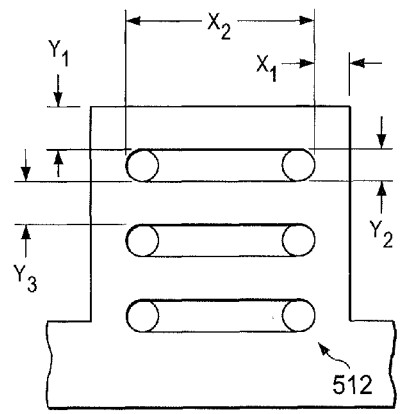
Figure 5G:
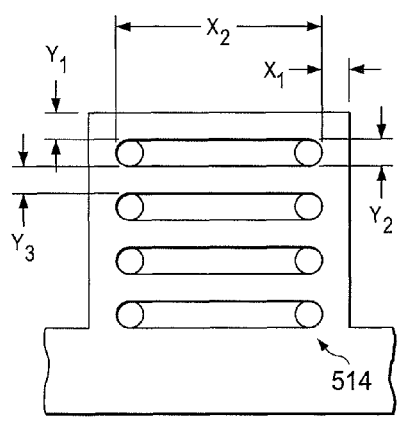
Figure 5H:
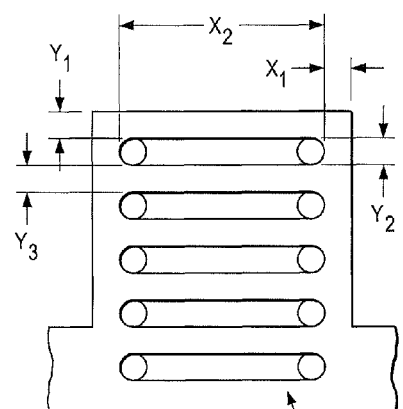
Figures 5I, 5J:
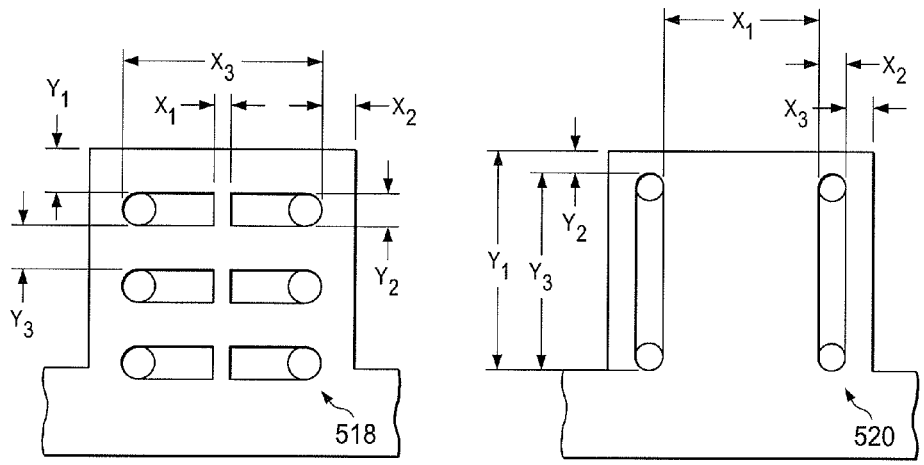

As shown in FIG. 5D, a collection of flow channels 508 includes three rectangular channels. FIGS. 5E through 5H illustrate collections of horizontal flow channels 510-516 that are rectangular with rounded ends. The following example dimensions could be used in particular implementations of these flow channels. Note that these values are approximate values only. In FIG. 5E, dimension $X_1$ could be 0.475 inches, dimension $X_2$ could be 0.0625 inches, and dimension $X_3$ could be 0.350 inches. Also, dimensions $Y_1$, $Y_2$, and $Y_3$ could each be 0.100 inches. In FIG. 5F, dimension $X_1$ could be 0.0625 inches, and dimension $X_2$ could be 0.350 inches. Also, dimensions $Y_1$ and $Y_3$ could each be 0.075 inches, and dimension $Y_2$ could be 0.060 inches. In FIG. 5G, dimensions $X_1$, $Y_1$, $Y_2$, and $Y_3$ could each be 0.050 inches, and dimension $X_2$ could be 0.375 inches. In FIG. 5H, dimensions $X_1$, $Y_1$, $Y_2$, and $Y_3$ could each be 0.050 inches, and dimension $X_2$ could be 0.375 inches. FIG. 5I illustrates a three-by-two collection of horizontal flow channels 518 that are rectangular, each with one rounded end. In FIG. 5I, dimension $X_1$ could be 0.030 inches, dimension $X_2$ could be 0.0625 inches, and dimension $X_3$ could be 0.350 inches. Also, dimensions $Y_1$ and $Y_3$ could each be 0.075 inches, and dimension $Y_2$ could be 0.060 inches.

FIG. 5J illustrates a collection of vertical flow channels 520 that are rectangular with rounded ends. In FIG. 5J, dimension $X_1$ could be 0.275 inches and dimensions $X_2$ and $X_3$ could each be 0.050 inches. Also, dimension $Y_1$ could be 0.386 inches, dimension $Y_2$ could be 0.350 inches, and dimension $Y_3$ could be 0.036 inches.

Although FIGS. 5A through 5J illustrate examples of flow channels inside ribs that separate electronic components within an electronics enclosure, various changes may be made to FIGS. 5A through 5J. For example, the cross-sections and dimensions described above are for illustration only. A flow channel or a collection of flow channels through a rib in an electronics enclosure could have any suitable cross-section, and the flow channel(s) could have any suitable dimensions. Also, the electronics enclosures described above could use any other suitable flow channels and are not limited to those shown here. For instance, the selection of the flow channels could be based on the thermal and flow properties needed for a specific application. Further, note that a combination of flow channels could be used.

Figure 6A:
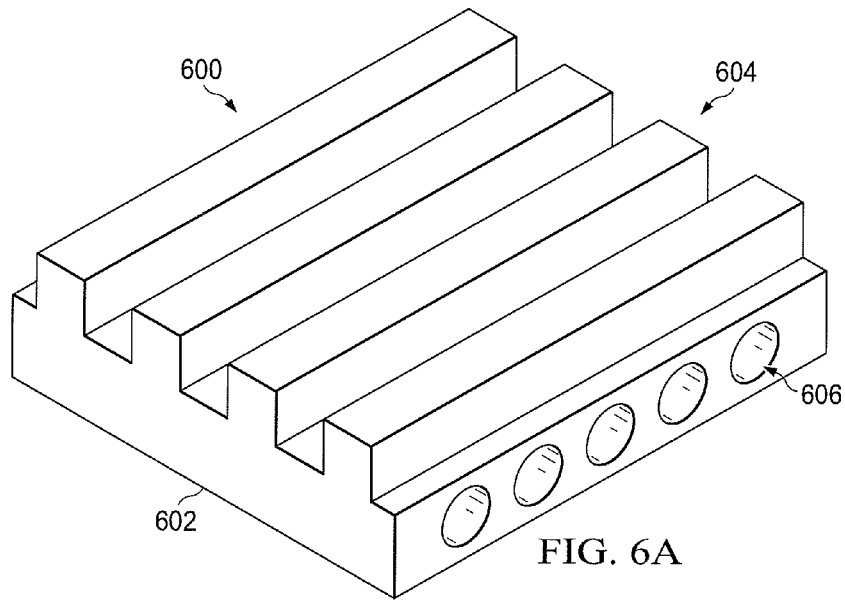
FIGS. 6A and 6B illustrate example channels inside walls of an electronics enclosure in accordance with this disclosure.
Figure 6B:
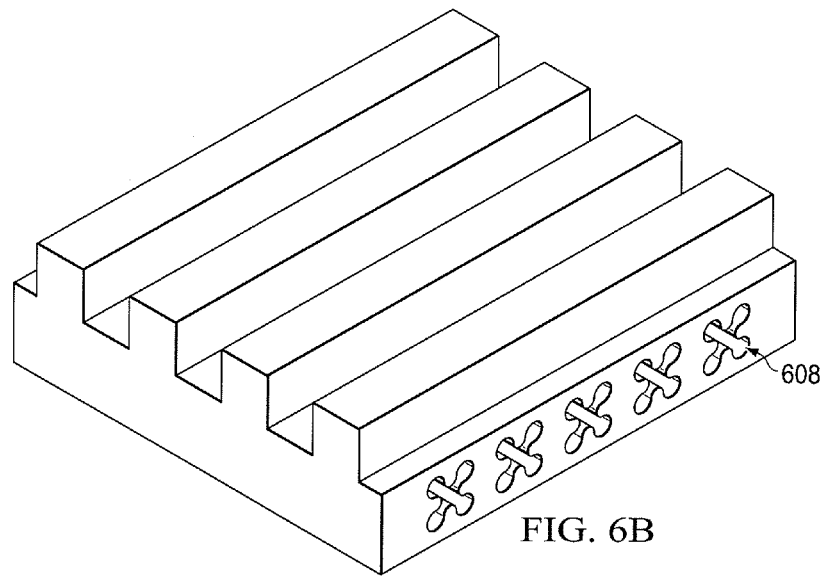

FIGS. 6A and 6B illustrate example channels inside walls of an electronics enclosure in accordance with this disclosure. In the electronics enclosures described above, the flow channels in the fluid transport structures are within the ribs of the electronics enclosures. As a result, cooling fluid physically flows through those ribs during operation. In FIGS. 6A and 6B, however, multiple channels allow cooling fluid to flow through the walls of an electronics enclosure without actually flowing through the ribs. In FIG. 6A, for example, a portion 600 of an electronics enclosure includes a wall 602 and multiple ribs 604. The wall 602 includes multiple channels 606 (in this case five channels). The channels 606 represent passages lined with at least one material resistant to corrosion from the cooling fluid (such as nickel). The remainder of the wall 602 could be formed from at least one other material such as aluminum (although as noted above a plating or coating could be placed on the wall). In FIG. 6A, the channels 606 have a generally circular cross-section. FIG. 6B shows channels 608 having a cross-sectional shape similar to that shown in FIG. 5B. In particular embodiments, the channels can run substantially perpendicular to the ribs 604 of the enclosure.

In one aspect of operation, cooling fluid can be pumped, injected, or otherwise provided into one or more of the channels 606-608. For example, cooling fluid could be provided to all channels 606-608 at a first end of the wall 602 and recovered from the channels 606-608 at a second end of the wall 602. As another example, cooling fluid could be provided to some channels 606-608 at a first end of the wall 602 and recovered from other channels 606-608 at the first end of the wall 602, such as when two channel 606-608 are linked at the second end of the wall 602. A channel 606-608 could reside along a single wall or wrap around multiple walls of the enclosure (such as when a U-shaped channel is used to cool ribs on opposite sides of the enclosure).

Note that this approach might provide less thermal performance than the enclosures of FIGS. 1 through 4C since the cooling fluid removes heat from the walls of an enclosure rather than from the ribs of the enclosure. Still, adequate thermal performance could be obtained for various applications. Note that a process similar to that shown in FIGS. 2A through 2H could be used to fabricate an electronics enclosure having channels in its walls. For instance, a fluid transport structure of nickel or other corrosion-resistant material(s) could be fabricated over a form, and the form could be removed. The fluid transport structure could then be encased in an aluminum or other casting, where the fluid transport structure forms channels in the walls of the casting. The casting can then be processed to finalize the construction of an electronics enclosure.

Although FIGS. 6A and 6B illustrate examples of channels inside walls of an electronics enclosure, various changes may be made to FIGS. 6A and 6B. For example, any other suitable cross-sectional shape could be used for channels within walls of an electronics enclosure, including any of the cross-sections shown in FIGS. 5A through 5J.

In particular embodiments, any of the electronics enclosures described above could satisfy the following functional specifications. The electronics enclosures can be used with electronics consuming at least about 130 W of power per slot and in systems with electronics consuming at least about 1,500 W of power per cubic foot. The electronics enclosures could have the capacity to cool up to sixteen circuit boards each. Heat transfer efficiency of at least about 4.4 W/° C. per gallon of fluid (such as about 8 W/° C. or more) can be obtained between the cooling fluid and the mounting interface where the circuit boards or other electronics are mounted to the electronics enclosure. The electronics enclosures could have a minimum operational lifespan of at least seven years with less than an about 10% reduction in thermal performance during that time. The maximum flow rate of cooling fluid through an enclosure could be about one to about three gallons per minute (GPM), and the maximum pressure drop of cooling fluid through an enclosure could be about 4 PSI/GPM. In addition, the electronics enclosures described above could achieve significant weight reduction (such as about 25% or more) and could have similar fabrication costs (such as about 1.4 times or less) compared to conventional liquid-cooled enclosures.

Additional features could also be incorporated into any of the electronics enclosures described above. For example, the electronics enclosures could include protective coatings to handle relative humidity, salt fog, or cooling fluid exposure on the outer surfaces of the electronics enclosures. Also, various gaskets could be used to provide atmospheric pressure protection, submergence protection, and EMI shielding compliance. In addition, note that any feature in one or more of the electronics enclosures described above could be used in any other electronics enclosure described above. That is, the use of a feature is not limited to the specific drawing(s) in which that feature is shown, and any combination of features described above could be used.

Figure 7A:
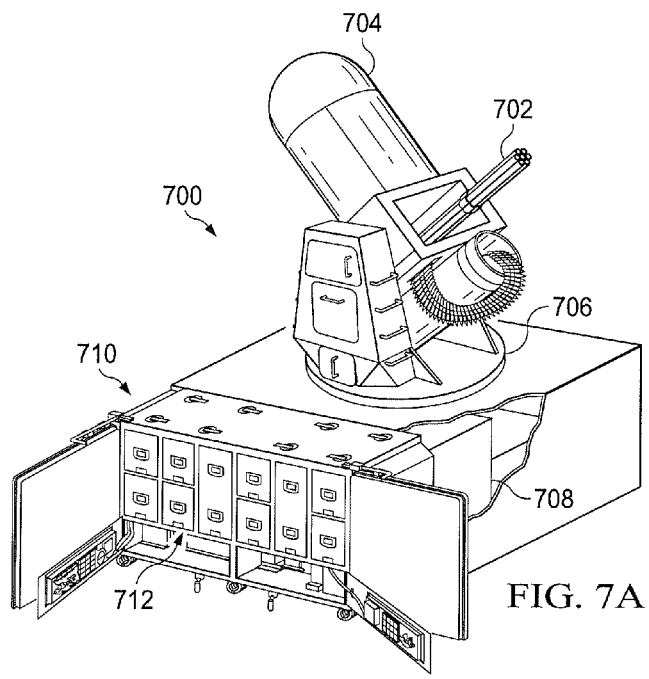
FIGS. 7A and 7B illustrate an example system using electronics enclosures with high thermal performance in accordance with this disclosure.
Figure 7B:
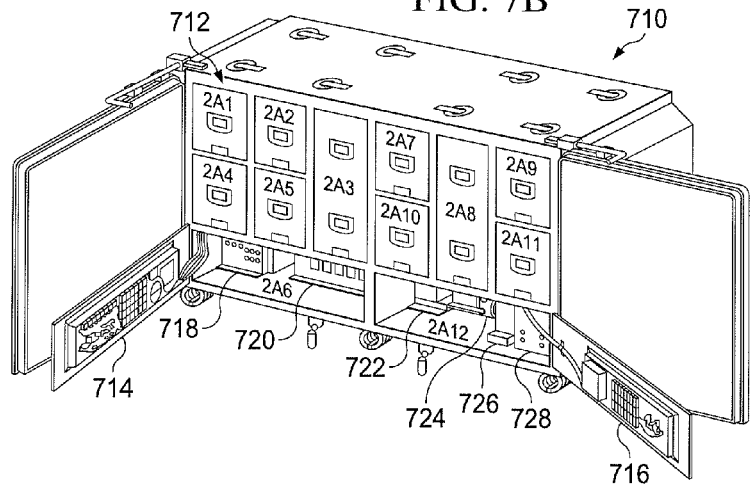

The electronics enclosures described above could find use in a wide variety of systems and devices where cooling of electronic components is desired or required. For example, these electronics enclosures could be used in any device or system using high-power and densely-packaged electronics. FIGS. 7A and 7B illustrate an example system 700 using electronics enclosures with high thermal performance in accordance with this disclosure. In this particular example, the system 700 represents a missile defense system for naval vessels, ground troops, and other military forces. The system 700 generally operates to destroy incoming missiles, rockets, artillery shells, or other ordnance. This particular system 700 represents a PHALANX close-in weapon system (CIWS), although other types of weapon systems could be used.

As shown in FIG. 7A, the system 700 includes a Gatling gun 702, such as a 20 mm gun, which is used to fire rounds at incoming ordnance. A radar system 704 is used to track the incoming ordnance so that the gun 702 can be aimed properly. The gun 702 is mounted on a swivel base 706, which can move to position the gun 702. The system 700 also includes a microwave cabinet 708, which contains various components used in conjunction with the radar system 704.

The system 700 further includes a large electronics enclosure (ELX) 710, which includes a number of drawers 712 that house various electronic components supporting operation of the system 700. FIG. 7B illustrates the ELX 710 in greater detail. As shown in FIG. 7B, the ELX 710 includes the drawers 712, which could slide into and out of the ELX 710. The ELX 710 also includes left and right panel assemblies 714-716, an electro-mechanical power supply 718, an electronics power supply 720, a step-down transformer 722, an inverter-relay assembly 724, a voltage and phase sensor 726, and a radio frequency interference (RFI) filter 728. Additional details regarding the PHALANX system are known to those skilled in the art and are not provided here.

Conventional PHALANX systems use a large blower to force air through a liquid-to-air heat exchanger into the ELX 710 and through the drawers 712. In accordance with this disclosure, however, the drawers 712 can be implemented using any of the liquid-cooled electronics enclosures described above in FIGS. 1 through 6B. The PHALANX system uses a de-ionized ethylene glycol water mixture that is highly corrosive to bare aluminum parts, so conventional liquid-based cooling systems that use aluminum could not be used. Moreover, conventional liquid-based cooling systems that use stainless steel cannot provide the necessary thermal performance. In contrast, the electronics enclosures described above can be used with a de-ionized ethylene glycol water mixture as the cooling fluid and can provide the necessary thermal performance.

Although FIGS. 7A and 7B illustrate one example of a system 700 using electronics enclosures with high thermal performance, various changes may be made to FIGS. 7A and 7B. For example, the electronics enclosures described above could be used in any other suitable device or system.

Figure 8:
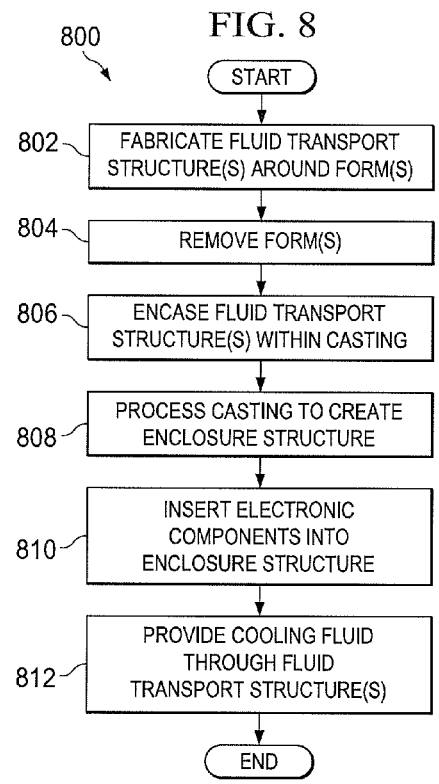
FIG. 8 illustrates an example method for forming an electronics enclosure with high thermal performance in accordance with this disclosure.

FIG. 8 illustrates an example method 800 for forming an electronics enclosure with high thermal performance in accordance with this disclosure. As shown in FIG. 8, one or more fluid transport structures are formed around one or more forms at step 802. This could include, for example, electroforming or otherwise depositing pure or substantially pure nickel around an aluminum, plastic, or other form structure. The one or more forms are then removed at step 804. This could include, for example, etching, drilling, burning, or otherwise removing the aluminum, plastic, or other form structure from within the fluid transport structure(s).

The one or more fluid transport structures are encased within a casting at step 806. This could include, for example, casting aluminum or other material(s) around the fluid transport structure(s) using the fluid transport structure(s) as a mold core. Note that the term "casting" (when referring to a structure) encompasses any structure encasing one or more fluid transport structures. The casting is then processed to create a finished enclosure structure at step 808. This could include, for example, machining the aluminum casting using conventional or other aluminum machining techniques.

At this point, the finished enclosure structure can be used in any suitable manner. For instance, electronic components can be inserted into the enclosure structure at step 810, and cooling fluid can be provided to the fluid transport structure(s) at step 812. This could include, for example, providing a corrosive de-ionized ethylene glycol water mixture to the fluid transport structure(s) in order to pull heat away from the electronic components.

Although FIG. 8 illustrates one example of a method 800 for forming an electronics enclosure with high thermal performance, various changes may be made to FIG. 8. For example, any suitable operations could be performed during each step of FIG. 8.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
  an electronics enclosure having multiple ribs configured to separate electronic components, each rib having a length from a first end to a second end; and
  at least one fluid transport structure encased within the electronics enclosure, each fluid transport structure including multiple pipes and multiple flow channels;
  wherein each flow channel is located substantially within a corresponding one of the ribs of the electronics enclosure such that the flow channel extends substantially along the length of that rib from the first end to the second end, and the pipes are configured to transport cooling fluid to and from the flow channels; and
  wherein the at least one fluid transport structure is resistant to corrosion caused by the cooling fluid and the electronics enclosure is susceptible to corrosion caused by the cooling fluid.

2. The apparatus of claim 1, wherein the at least one fluid transport structure consists essentially of a single layer of a corrosion resistant material.

3. The apparatus of claim 2, wherein:
  the single layer of the at least one fluid transport structure consists essentially of nickel; and
  the electronics enclosure consists essentially of aluminum.

4. The apparatus of claim 1, wherein:
  the apparatus comprises multiple fluid transport structures;
  the multiple fluid transport structures are encased on opposite sides of the electronics enclosure;
  one pipe in each fluid transport structure is configured to provide the cooling fluid to the flow channels located along one side of the electronics enclosure; and
  another pipe in each fluid transport structure is configured to receive the cooling fluid from the flow channels located along one side of the electronics enclosure.

5. The apparatus of claim 1, wherein:
  the apparatus comprises a single fluid transport structure;
  one pipe in the fluid transport structure is configured to provide the cooling fluid to the flow channels located along two sides of the electronics enclosure; and
  another pipe in the fluid transport structure is configured to receive the cooling fluid from the flow channels located along two sides of the electronics enclosure.

6. The apparatus of claim 5, wherein the single fluid transport structure comprises two U-shaped pipes fluidly coupled to different ends of the flow channels.

7. The apparatus of claim 1, wherein each pipe is coupled to at least one port configured to receive or provide the cooling fluid.

8. The apparatus of claim 1, wherein:
  the at least one fluid transport structure is integrally formed of nickel using metal deposition; and
  the electronics enclosure is formed of aluminum cast around the at least one fluid transport structure.

9. The apparatus of claim 1, wherein at least one of the flow channels has a cross-sectional shape comprising one of:
  a central area surrounded by a plurality of interconnected partial or near-complete circular areas; or
  a plurality of near-complete circular areas arranged in a two-dimensional matrix and interconnected via thinner paths to a smaller central area.

10. An apparatus comprising:
  an electronics enclosure surrounding an open space, wherein an inside surface of the electronics enclosure comprises multiple ribs configured to separate electronic components disposed within the open space, each rib having a length from a first end to a second end; and
  at least one fluid transport structure encased within the electronics enclosure, each fluid transport structure including multiple pipes and multiple flow channels;
  wherein each flow channel is located substantially within a corresponding one of the ribs of the electronics enclosure such that the flow channel extends substantially along the length of that rib from the first end to the second end, and the pipes are configured to transport cooling fluid to and from the flow channels; and
  wherein the at least one fluid transport structure is resistant to corrosion caused by the cooling fluid and the electronics enclosure is susceptible to corrosion caused by the cooling fluid.

11. The apparatus of claim 10, wherein the at least one fluid transport structure consists essentially of a single layer of a corrosion resistant material.

12. The apparatus of claim 11, wherein:
  the single layer of the at least one fluid transport structure consists essentially of nickel; and
  the electronics enclosure consists essentially of aluminum.

13. The apparatus of claim 10, wherein:
the apparatus comprises multiple fluid transport structures;
the multiple fluid transport structures are encased on opposite sides of the electronics enclosure;
one pipe in each fluid transport structure is configured to provide the cooling fluid to the flow channels located along one side of the electronics enclosure; and
another pipe in each fluid transport structure is configured to receive the cooling fluid from the flow channels located along one side of the electronics enclosure.

14. The apparatus of claim 10, wherein:
the apparatus comprises a single fluid transport structure;
one pipe in the fluid transport structure is configured to provide the cooling fluid to the flow channels located along two sides of the electronics enclosure; and
another pipe in the fluid transport structure is configured to receive the cooling fluid from the flow channels located along two sides of the electronics enclosure.

15. The apparatus of claim 14, wherein the single fluid transport structure comprises two U-shaped pipes fluidly coupled to different ends of the flow channels.

16. The apparatus of claim 10, wherein each pipe is coupled to at least one port configured to receive or provide the cooling fluid.

17. A system comprising:
an artillery device; and
a cabinet comprising:
  an electronics enclosure having multiple ribs configured to separate electronic components associated with the artillery device, each rib having a length from a first end to a second end; and
  at least one fluid transport structure encased within the electronics enclosure, each fluid transport structure including multiple pipes and multiple flow channels;
wherein each flow channel is located substantially within a corresponding one of the ribs of the electronics enclosure such that the flow channel extends substantially along the length of that rib from the first end to the second end, and the pipes are configured to transport cooling fluid to and from the flow channels; and
wherein the at least one fluid transport structure is resistant to corrosion caused by the cooling fluid and the electronics enclosure is susceptible to corrosion caused by the cooling fluid.

18. The system of claim 17, wherein the at least one fluid transport structure consists essentially of a single layer of a corrosion resistant material.

19. The system of claim 18, wherein:
the single layer of the at least one fluid transport structure consists essentially of nickel; and
the electronics enclosure consists essentially of aluminum.

20. The system of claim 17, wherein:
the apparatus comprises multiple fluid transport structures;
the multiple fluid transport structures are encased on opposite sides of the electronics enclosure;
one pipe in each fluid transport structure is configured to provide the cooling fluid to the flow channels located along one side of the electronics enclosure; and
another pipe in each fluid transport structure is configured to receive the cooling fluid from the flow channels located along one side of the electronics enclosure.

21. The system of claim 17, wherein:
the apparatus comprises a single fluid transport structure;
one pipe in the fluid transport structure is configured to provide the cooling fluid to the flow channels located along two sides of the electronics enclosure; and
another pipe in the fluid transport structure is configured to receive the cooling fluid from the flow channels located along two sides of the electronics enclosure.

22. The system of claim 21, wherein the single fluid transport structure comprises two U-shaped pipes fluidly coupled to different ends of the flow channels.

\* \* \* \* \*